(12) United States Patent
Ito

(10) Patent No.: US 6,477,668 B1
(45) Date of Patent: Nov. 5, 2002

(54) SIGNAL GENERATION CIRCUIT OF SEMICONDUCTOR TESTING APPARATUS

(75) Inventor: Kiyoshi Ito, Tokyo (JP)

(73) Assignee: Ando Electric Co., Ltd., Tokyo (JP)

(*) Notice: Subject to any disclaimer, the term of this patent is extended or adjusted under 35 U.S.C. 154(b) by 0 days.

(21) Appl. No.: 09/576,095

(22) Filed: May 22, 2000

(30) Foreign Application Priority Data

May 31, 1999 (JP) ............................................ 11-153075

(51) Int. Cl.[7] .................................................. G06K 5/04
(52) U.S. Cl. ...................................................... 714/700
(58) Field of Search ................................ 714/700, 736, 714/744; 324/73.1; 327/294

(56) References Cited

U.S. PATENT DOCUMENTS

| | | | | |
|---|---|---|---|---|
| 4,497,056 A | * | 1/1985 | Sugamori | .................... 714/736 |
| 4,806,852 A | * | 2/1989 | Swan et al. | ................. 324/73.1 |
| 4,928,278 A | * | 5/1990 | Otsuji et al. | ................. 714/700 |
| 5,321,702 A | * | 6/1994 | Brown et al. | ............... 714/744 |
| 5,703,515 A | * | 12/1997 | Toyama et al. | ............. 327/294 |

* cited by examiner

Primary Examiner—David Ton
(74) Attorney, Agent, or Firm—Fish & Richardson PC

(57) ABSTRACT

A signal is generated according to the waveform information designated by a program and outputted by the format channels 1 and 2. Skew correction circuits 51 to 54 are provided corresponding to the format channel 1 and 2, and the signal outputted from the corresponding format channel is used as the reference, and the skew of the signal outputted from the other format channel is corrected. Logical add circuits 61 to 64 are provided corresponding to the skew correction circuits 51 to 54, and compose the signal from the corresponding skew correction circuit and the signal from the format channel to which this skew correction circuit corresponds.

6 Claims, 5 Drawing Sheets

SIGNAL GENERATION CIRCUIT OF SEMICONDUCTOR TESTING APPARATUS

BACKGROUND OF THE INVENTION

The present invention relates to a signal generation circuit of a semiconductor testing apparatus, and particularly to a signal generation circuit provided with a skew correction function.

Conventionally, a semiconductor testing apparatus to test a semiconductor memory, has a signal generation circuit to generate a plurality of channel signals, and the signal generation circuit is composed of a plurality of format channels to generate signals according to a program in which testing procedure is written. The format channel is provided for each signal channel, and by composing a plurality of timing edges, generates a set-edge and reset-edge signals which regulate signals to be applied onto an object to be tested.

Herein, in the testing apparatus, because the transmission path of each timing edge signal is not necessarily the same, there is a skew between respective signals before composition, and signals are not applied on the testing object at the designated timing by the program. Therefore, in the signal generation circuit of the semiconductor testing apparatus, a skew correction circuit to correct the skew between respective signals before composition, is provided.

In FIG. 5, the structure of the conventional signal generation circuit of the semiconductor testing apparatus is shown. In the drawing, numerals 1 and 2 are format channels, numeral 61 and 62 are logical add circuits to conduct the logical add of each of outputs of two format channels 1 and 2. Herein, the format channel 1 is structured by: clock selection circuits 11 to 13 which receive a plurality of timing edge signals from a timing generation section, not shown, and select one of them; a formatter circuit 21 to separate the output edge of the clock selection circuits 11 to 13 into a set-edge or a reset-edge; skew correction circuits 31 to 34 to correct the timing of the set-edge or reset-edge outputted from the formatter circuit 21; and logical add circuits 41 and 42 to conduct the logical add of respective set-edge and reset-edge whose skews are corrected.

Another format channel 2 is structured in the same manner as the format channel 1, and structured by: clock selection circuits 14 to 16 corresponding to clock selection circuits 11 to 13; a formatter circuit 22 corresponding to the formatter circuit 21; skew correction circuits 35 to 38 corresponding to skew correction circuits 31 to 34; and logical add circuits 43 and 44 corresponding to logical add circuits 41 and 42.

Next, operations of the signal generation circuit will be described. Initially, concerning a case of a normal mode in which separate signal s are generate d by each format channel, the format channel 1 will be described as an example.

The clock selection circuits 11 to 13 select one of timing edges described in a program for the tested device measurement from a plurality of timing edges generated from the timing generation section, not shown, and respectively output and supply it to the formatter circuit 21.

The formatter circuit 21 separates the edge signal inputted from each clock selection circuit into the set-edge and the reset-edge so that the waveform designated by the program can be applied onto the device. The set-edge and the reset-edge determine, for example, a rise timing and a fall timing of an address signal, and regulate the timing of each edge of the signal applied onto the tested device. When the formatter circuit 21 separates the edge signal from each clock selection circuit as the set-edge, the formatter circuit 21 outputs it to the logical add circuit 41, and when the formatter circuit 21 separates the edge signal from each clock selection circuit as the reset-edge, the formatter circuit 21 outputs it to the logical add circuit 42.

The skew correction circuits 31 to 34 correct the skew between signals inputted into logical add circuits 41 and 42. Concretely, the skew correction circuits 31 and 32 correct the set-edges respectively outputted from the formatter circuit 21 to the logical add circuit 41 according to the timing edge from the clock selection circuits 11 and 13, so that the same timing as that of the set-edge outputted from the formatter circuit 21 to the logical add circuit 41 can be obtained, according to the timing edge from the clock selection circuit 12. According to this, each set-edge is inputted into the logical add circuit 41 at the same timing.

Further, in the same manner, the skew correction circuits 33 and 34 correct the reset-edge outputted from the formatter circuit 21 to the logical add circuit 42 according to the timing edge from the clock selection circuits 11 and 13, so that the same timing can be obtained as the reset-edge outputted to the logical add circuit 42, according to the timing edge from the clock selection circuit 12. According to this, each set-edge is inputted into the logical add circuit 42 at the same timing.

The logical add circuit 41 conducts the logical add of each of set-edges separated by the formatter circuit 21, and composes them. That is, the logical add circuit 41 outputs a signal in which each set-edge outputted from the formatter circuit 21 is arranged. In the same manner, the logical add circuit 42 conducts the logical add of each of reset-edges separated by the formatter circuit 21, and composes them, and outputs a signal in which each set-edge is arranged.

The format channel 2 is operated in the same manner as the format channel 1, and respectively outputs a signal in which the set-edge is arranged to the channel to which the format channel 2 is allocated, and a signal in which the reset-edge is arranged, from the logical add circuits 43 and 44.

Incidentally, in this operation mode, signals of each format channel are not composed, and because channel signals corresponding to the output signals of each format channel are generated, the logical add circuits 61 and 62 which attribute to the signal composition, do not function. Accordingly, the operation of the logical add circuits 61 and 62 will be described in the next operation of a link mode.

Next, the operation of the link mode by which each format channel is linked and a signal is generated, will be described.

In this operation mode, both of the set-edges of the format channels 1 and 2 are composed by the logical add operation by the logical add circuit 61, and both of the reset-edges are composed by the logical add operation by the logical add circuit 62. That is, in this operation mode, one set signal in which both of each set-edge generated by the format channels 1 and 2 are arranged, is outputted from the logical add circuit 61, and one reset signal in which both of each reset-edge generated by the format channels 1 and 2 are arranged, is outputted from the logical add circuit 62. In this manner, according to this link mode, because apparently 2 time edges can be arranged on one signal, this mode can cope with the high speed device with high operation frequency.

Herein, when the skew between signals outputted from each of format channels is corrected in this link mode, for example, the output from the format channel 2 is corrected so that this output is outputted from the logical add circuit 61 at the same timing as the output of the format channel 1 by using the skew correction circuits 35 to 38.

Incidentally, according to the above-described conventional signal generation circuit, because the skew correction circuits 35 to 38 to correct the output of the format channel 2 at the time of the link mode, are also the circuits used at the time of the normal mode, there is a problem that, every time when the link mode and the normal mode are switched, it is necessary to send again the correction data appropriate for each mode to the skew correction circuits 35 to 38.

Further, in the link mode, because any one of skew correction circuits of 2 format channels is used and the skew correction for only one circuit can be conducted, there is a problem that the number of devices to be measured, which is operated at high speed, is reduced by half.

SUMMARY OF THE INVENTION

The invention is attained in view of the foregoing circumstances, and an object of the invention is to provide a signal generation circuit of a semiconductor testing apparatus by which the data transfer amount to the skew correction circuit can be reduced when 2 operation modes of the link mode and the normal mode are switched, and without reducing the number of effective channels and the number of devices to be measured, each of format channels can be used simultaneously, thereby, the measuring time of the integrated circuit to be tested can be reduced.

In order to attain the above object, this invention provides a circuit to conduct again the skew correction of the output of the format channel.

That is, this invention comprises: a plurality of signal generation sections (for example, a component corresponding to formatter circuits 1 and 23, which will be described later) to generate and output signals according to the waveform information designated by a program; a plurality of skew correction sections (for example, components corresponding to skew correction circuits 51 to 54, which will be described later) which are provided corresponding to the plurality of signal generation sections, and in which a signal outputted from the corresponding signal generation section is used as the reference, and by which the skews of the signals outputted from the other signal generation sections are corrected; and a plurality of signal composition sections (for example, components corresponding to the logical add circuits 61 to 64, which will be described later) which are provided corresponding to the plurality of skew correction sections, and by which the signal from the corresponding skew correction section and the signal from the signal generation section to which this skew correction section corresponds, are composed.

According to this invention, each skew correction section uses a signal outputted from the corresponding signal generation section as the reference, and corrects the skews of the signals outputted from the other signal generation sections so that their timing matches with the signal as the reference. According to this, the skew between signals from the signal generation section and the skew correction section, which correspond to each other, is eliminated, and these signals are composed to one signal by the signal composition section.

Each of the plurality of signal generation sections comprises: for example, a plurality of selection circuits (for example, components corresponding to clock selection circuits 11 to 13, 14 to 16, which will be described later) which respectively select one from a plurality of timing edges prepared previously according to the waveform information; a formatter circuit (for example, components corresponding to formatter circuits 1 and 2, which will be described later) which separates each timing edge selected by the plurality of selection circuits, into the set-edge and the reset-edge and output it, according to the waveform information; the first skew correction circuits (for example, components corresponding to skew correction circuits 31, 32, 35 and 36, which will be described later) which correct the skews between each of set edges separated by the formatter circuit; the second skew correction circuits (for example, components corresponding to skew correction circuits 33, 34, 37 and 38, which will be described later) which correct the skews between each of reset edges separated by the formatter circuit; the first logical add circuit (for example, components corresponding to logical add circuits 41 and 43, which will be described later) which conducts the logical add of the set-edges whose skew are corrected by the first skew correction circuits; and the second logical add circuit (for example, components corresponding to logical add circuits 42 and 44, which will be described later) which conducts the logical add of the reset-edges whose skew are corrected by the second skew correction circuits.

According to this structure, the timing edge selected by each selection circuit is inputted into the formatter circuit. The formatter circuit separates each timing edge inputted from each selection circuit respectively into the set-edge and the reset-edge. The first skew correction circuit corrects the skew between each of set-edges generated from each timing edge, and the second skew correction circuit corrects the skew between each of reset-edges generated from each timing edge. The first logical add circuit conducts the logical add of the set-edges whose skews are corrected, and composes the set-edges, and the second logical add circuit conducts the logical add of the reset-edges whose skews are corrected, and composes the reset-edges. According to this, the signal whose skew is corrected can be generated according to the waveform information designated by the program, and the set-edge and the reset-edge whose skews are respectively corrected, and each of which is respectively composed, can be obtained.

Herein, the plurality of signal composition sections is composed of, for example, logical add circuits (for example, components corresponding to logical add circuits 61 to 64, which will be described later), and the plurality of skew correction sections are composed of, for example, delay circuits. Skew correction sections (for example, components corresponding to numerals 71A, 71B to 74A and 74B, which will be described later) to correct the skew between each of signals respectively outputted from the plurality of signal composition sections, may be further provided. According to this, the skew of the signal outputted from each signal composition section can be corrected, thereby, the skew between these signals can be eliminated.

Further, this invention is a signal generation circuit of a semiconductor testing apparatus which has a plurality of selection circuits (for example, components corresponding to clock selection circuits 11 to 13, 14 to 16, which will be described later) to sect one from a plurality of timing edges, and in which outputs of the selection circuits are connected to a formatter circuit (for example, a component corresponding to formatter circuits 1 and 2, which will be described later), and outputs from the formatter circuit are connected to logical add circuits (for example, components corresponding to skew correction circuits 31 to 34, 35 to 38, which will be described later), and the output of the logical add circuit is connected to a composition circuit (for example, a component corresponding to logical add circuits 61 to 64, which will be described later) by which the output of the logical add circuit and the other same output are composed, the signal generation circuit of a semiconductor testing apparatus is characterized in that: a correction circuit (for example, a component corresponding to skew correction circuits 51 to 54, which will be described later) to correct the skew of the signal inputted from the logical add circuit to the composition circuit is provided.

According to this structure, because the correction circuit corrects the skew of the signal outputted from the logical add circuit, the timing of the signals inputted into the composition circuit matches with each other, and signals are composed under the condition that the skew is eliminated.

DETAILED DESCRIPTION OF THE PREFERRED EMBODIMENTS

Figure 1:
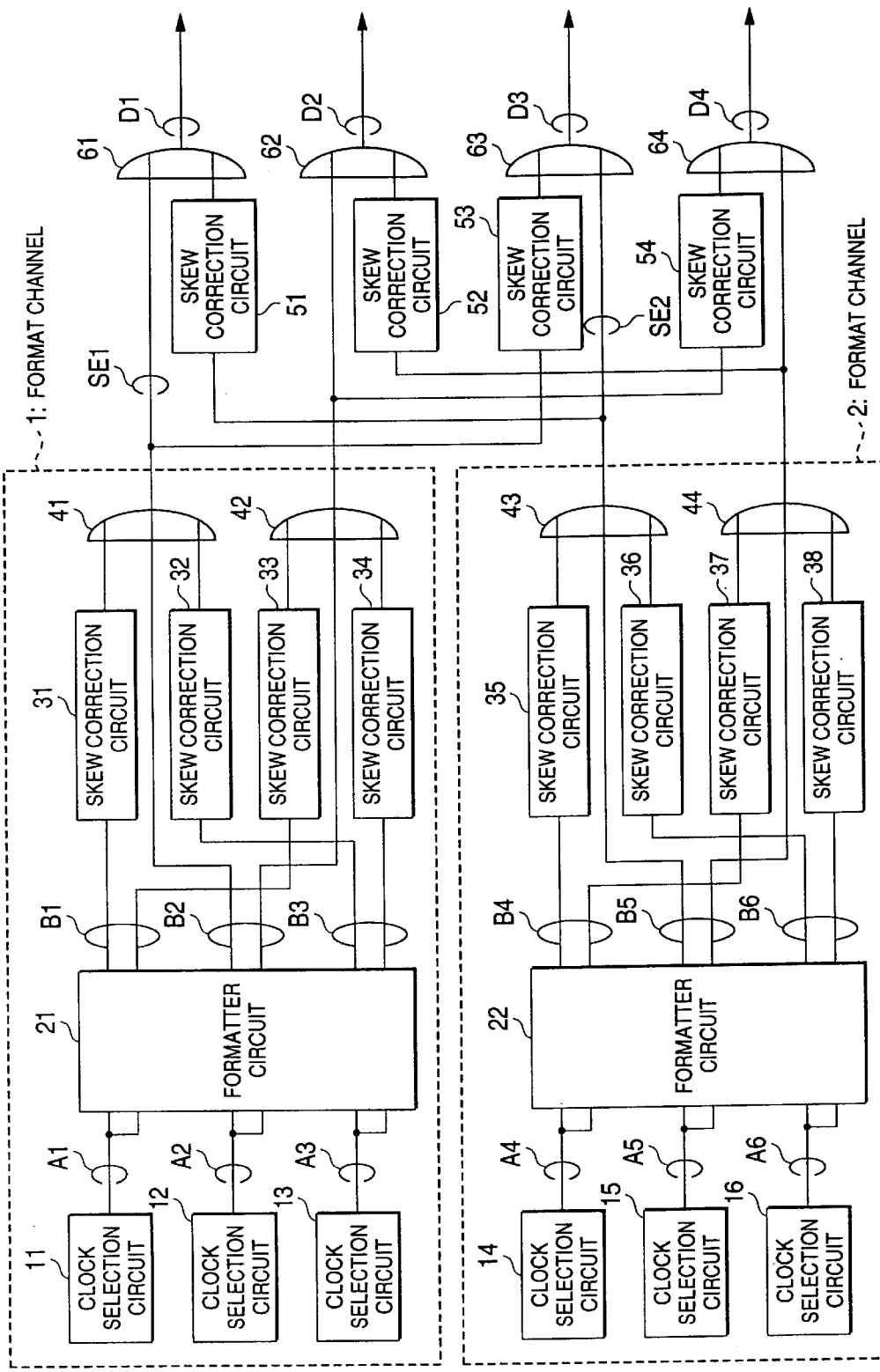
FIG. 1 is a block diagram showing the structure (at the time of the link mode) of a signal generation circuit according to the embodiment 1 of the present invention.

Referring to the drawings, the mode for carrying out the invention will be described below.

Prior to the description of the embodiment, the concept of "askew" will be defined here. Generally, the skew is a concept expressing the slippage of the timing of the signal due to a change of inclination of the waveform, however, in the present invention, it is defined that all of things which cause the slippage of the timing are included in the concept of the skew, and accordingly, of course, the inclination of the waveform and only the slippage of phase are also included in the concept of the skew.

Embodiment 1

Figure 5:
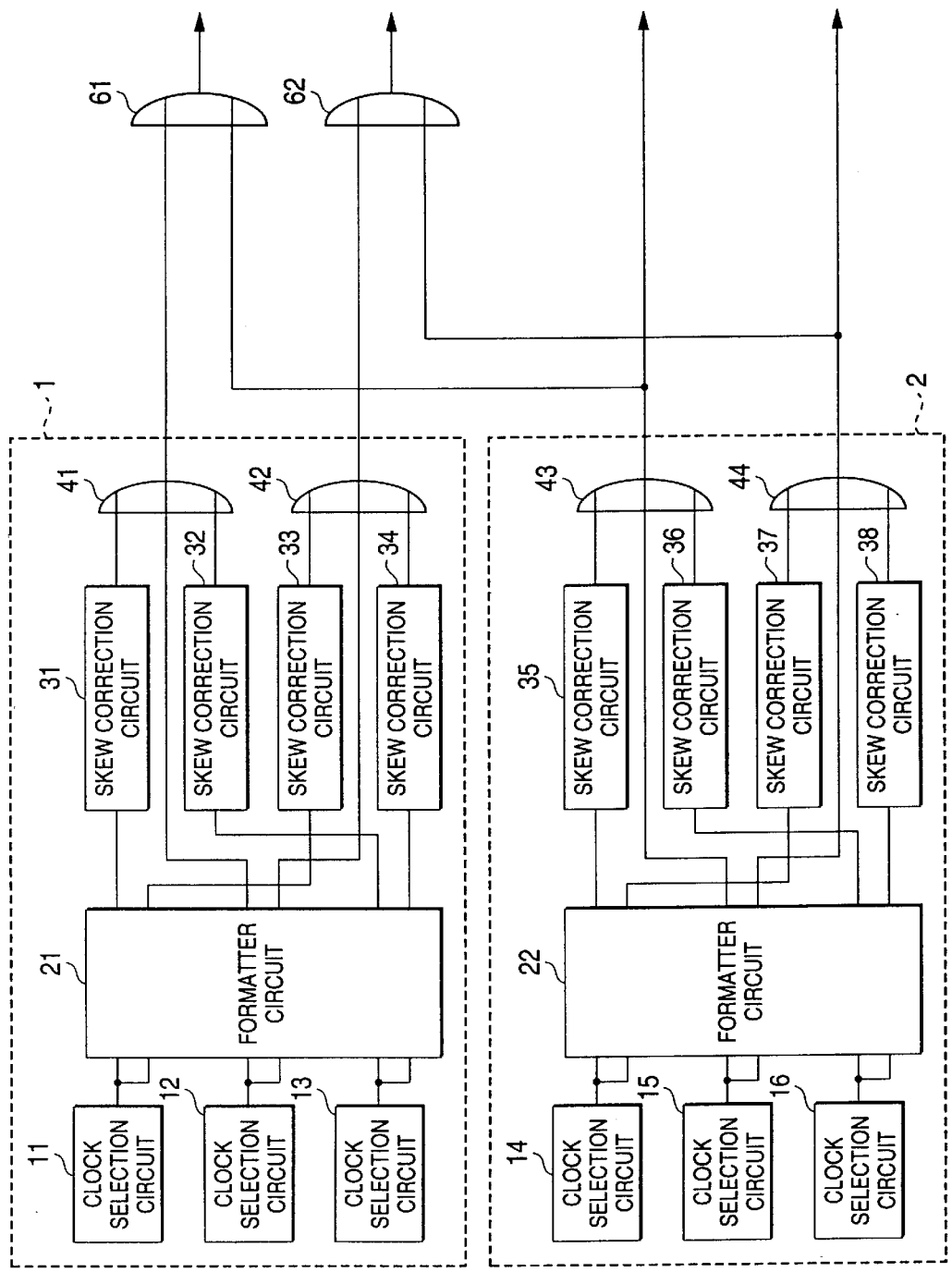
FIG. 5 is a block diagram showing an example of the structure of the signal generation circuit according to the conventional technology.

A structure of a signal generation circuit of a semiconductor testing apparatus according to the embodiment 1 of the present invention will be shown in FIG. 1. In FIG. 1, an element common to the element shown in FIG. 5 is denoted by the same numeral and code. As shown in FIG. 1, the signal generation circuit according to this embodiment is, in the structure shown in the above-described FIG. 5, structured by being further provided with skew correction circuits 51 to 54, and the logical add circuits 63 and 64.

The structure of the signal generation circuit shown in FIG. 1 will be detailed below. In FIG. 1, numerals 1 and 2 are format channels which generate and output signals according to the waveform information designated by a program; numerals 51 to 54 are skew correction circuits, for exclusive use for the link mode, which are provided to correspond to the format channels 1 and 2, and correct the skew between the signals respectively outputted from these format channels at the time of the link mode; and numerals 61 to 64 are logical add circuits which are provided to correspond to the skew correction circuits 51 to 54, and compose signals whose skews are corrected by these skew correction circuits.

Herein, the skew correction circuit 51 corrects the timing of the set-edge signal outputted from the format channel 2 with respect to the set-edge signal outputted from the format channel 1, and is structured such that the signal outputted from the format channel 1 is used as the reference, and the skew between set-edge signals outputted from each of format channels is corrected. Further, the skew correction circuit 52 corrects the timing of the reset-edge signal outputted from the format channel 2 with respect to the reset-edge signal outputted from the format channel 1, and is structured such that the signal outputted from the format channel 1 is used as the reference, and the skew between reset-edge signals outputted from each of format channels is corrected.

The skew correction circuit 53 corrects the timing of the set-edge signal outputted from the format channel 2 with respect to the set-edge signal outputted from the format channel 1, and is structured such that the signal outputted from the format channel 2 is used as the reference, and the skew between set-edge signals outputted from each of format channels is corrected. Further, the skew correction circuit 54 corrects the timing of the reset-edge signal outputted from the format channel 1 with respect to the reset-edge signal outputted from the format channel 2, and is structured such that the signal outputted from the format channel 2 is used as the reference, and the skew between reset-edge signals outputted from each of format channels is corrected. The skew correction circuits 51 to 54 are structured by, for example, delay circuits.

The logical add circuit 61 conducts the logical add of the set-edge signal outputted from the format channel 1 and the set-edge signal which is outputted from the format channel 2 and corrected by the skew correction circuit 51, and composes these set-edge signals as one signal. The logical add circuit 62 conducts the logical add of the reset-edge signal outputted from the format channel 1 and the reset-edge signal which is outputted from the format channel 2 and corrected by the skew correction circuit 52, and composes these reset-edge signals as one signal.

The logical add circuit 63 conducts the logical add of the set-edge signal outputted from the format channel 2 and the set-edge signal which is outputted from the format channel 1 and corrected by the skew correction circuit 53, and composes these set-edge signals as one signal. The logical add circuit 64 conducts the logical add of the reset-edge signal outputted from the format channel 2 and the reset-edge signal which is outputted from the format channel 1 and corrected by the skew correction circuit 54, and composes these reset-edge signals as one signal.

The format channel 1 is structured by: clock selection circuits 11 to 13 which receive a plurality of timing edge signals from a timing generation section, not shown, and select one of them; a formatter circuit 21 to separate the output edge of the clock selection circuits 11 to 13 into a set-edge or a reset-edge; skew correction circuits 31 and 32 to correct the skew between set-edges outputted from the formatter circuit 21; skew correction circuits 33 and 34 to correct the skew between reset-edges outputted from the formatter circuit 21; the logical add circuit 41 to conduct the logical add of respective set-edges whose skews are corrected; and the logical add circuit 42 to conduct the logical add of respective reset-edges whose skews are corrected.

Another format channel 2 is structured in the same manner as the format channel 1, and structured by: clock selection circuits 14 to 16 corresponding to clock selection circuits 11 to 13; a formatter circuit 22 corresponding to the formatter circuit 21; skew correction circuits 35 to 38 corresponding to skew correction circuits 31 to 34; and logical add circuits 43 and 44 corresponding to logical add circuits 41 and 42.

Next, referring to a timing chart shown in FIG. 2, operations of the signal generation circuit according to this embodiment will be described.

Initially, concerning the case of the normal mode (that is, the operation mode to generate respective signals by each format channel), the format channel 1 will be described as an example.

Initially, clock signals of a plurality of timing edges are generated from the timing generation section, not shown, and supplied to respective clock selection circuits 11 to 16.

Figure 2:
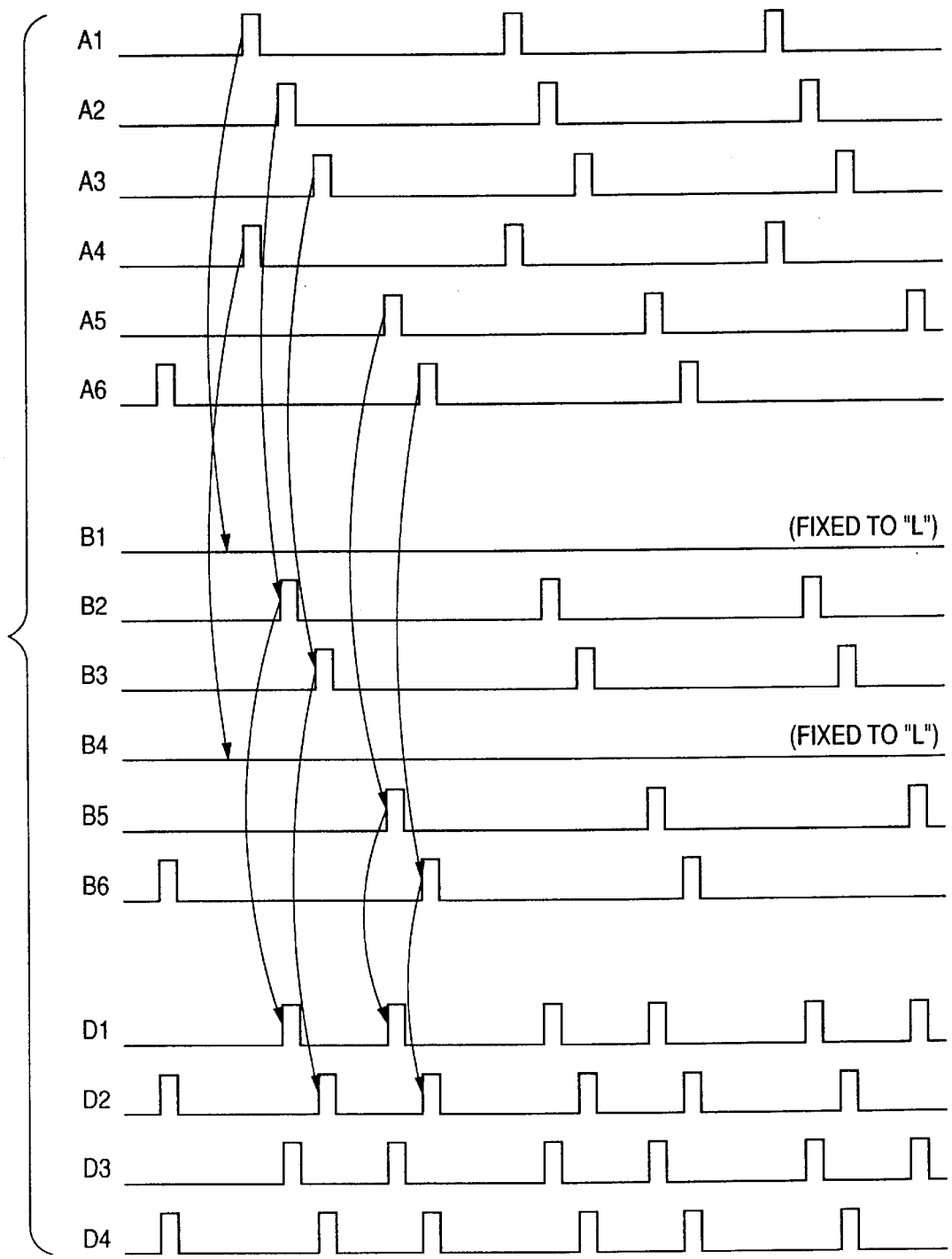
FIG. 2 is a timing chart for explaining the operation of the signal generation circuit according to the embodiment 1 of the present invention.

Herein, in the timing generation section, not shown, clock signals of the timing edges A1 to A6 as shown from the uppermost stage to the sixth stage in FIG. 2, and of each kind of timing edges except them, are generated. These timing edges are generated as clock signals in which, for example, periods are the same and only phases are different, and finally, used to regulate the timing of each kind of waveforms such as rise and fall of, for example, address signals or data signals which are applied onto the device to be measured of the text object. That is, the waveform of the signal applied onto the device to be measured can be arbitrarily regulated according to which timing edges are selected and combined.

Clock selection circuits 11 to 13 of the format channel 1 respectively select one timing edge described in the program for the tested device measurement form a plurality of timing edges generated from the timing generation section, and respectively supply the timing edges A1 to A3 to the formatter circuit 21. In the example shown in FIG. 2, the timing edge A1 is used as the reference, and phases of the timing edges A2 and A3 are delayed in order.

In the same manner, clock selection circuits 14 to 16 of the format channel 2 respectively supply the timing edges A4 to A6 to the formatter circuit 22. In the example shown in FIG. 2, the timing edge A4 has the same phase as the timing edge A1, and the phase of the timing edge A5 is delayed from that of the timing edge A3, and the phase of the timing edge A6 is advanced from that of the timing edge A1.

The formatter circuit 21 separates the edge signal inputted from each clock selection circuit into the set-edge and the reset-edge so that the waveform designated by the program can be applied onto the device. These set-edge and the reset-edge respectively regulate, for example, the rise timing and fall timing of the address signal applied onto the device to be measured.

In the example shown in FIG. 2, the timing edge A2 inputted from the clock selection circuit 12 is separated as the reset-edge B2, by the formatter circuit 21, and the timing edge A3 inputted from the clock selection circuit 13 is separated as the timing edge B3 of the reset-edge, and the timing edge A1 inputted from the clock selection circuit 11 is fixed to a low level "L". The formatter circuit 21 outputs the set-edge to the logical add circuit 41 when the formatter circuit 21 separates the timing edge from the clock selection circuits 11 to 13 as the set-edge, and outputs the reset-edge to the logical add circuit 42 when the circuit 21 separates the timing edge as the re-set edge.

In the same manner, the formatter circuit 22 separates the edge signals inputted from each clock selection circuit, into the set-edge and the reset-edge. In the example shown in FIG. 2, the timing edge A5 inputted from the clock selection circuit 15 is separated as the reset-edge B5, by the formatter circuit 21, and the timing edge A6 inputted from the clock selection circuit 16 is separated as the timing edge B6 of the reset-edge, and the timing edge A4 inputted from the clock selection circuit 14 is fixed to a low level "L". The formatter circuit 22, in the same manner as the formatter circuit 21, when the formatter circuit 22 separates the timing edge from the clock selection circuits 14 to 16 as the set-edge, the circuit 22 outputs the set-edge to the logical add circuit 43, and when the circuit 22 separates the timing edge as the re-set edge, the circuit 22 outputs the reset-edge to the logical add circuit 44.

The skew correction circuits 31 and 32 of the formatter circuit 1 correct the skew so that the timing of set-edge signals inputted into the logical add circuit 41 matches with each other. Concretely, because the timing edge B1 inputted into the skew correction circuit 31 as the set-edge, is a low level "L", this skew correction circuit 31 supplies this low level "L" to the logical add circuit 41 as it is.

The skew correction circuit 32 into which the timing edge B3 is inputted as the set-edge, uses the timing edge B2 separated as the set-edge as the reference, and corrects the timing of the timing edge B3, and corrects the skew between them. Thereby, the skew between each of set-edges outputted from the formatter circuit 21 is eliminated, and each of set edges is inputted into the logical add circuit 41 at the same timing, and these set-edges are composed as one set-edge signal.

Further, the skew correction circuits 33 and 34 of the formatter circuit 1 correct the skew of the reset-edge signals inputted into the logical add circuit 42. Concretely, because the timing edge B1 inputted into the skew correction circuit 33 as the reset-edge, is a low level "L", this skew correction circuit 33 supplies this low level "L" to the logical add circuit 42 as it is.

The skew correction circuit 34 into which the timing edge B3 is inputted as the reset-edge, uses the timing edge B2 separated as the reset-edge as the reference, and corrects the timing of the timing edge B3, and corrects the skew between them. Thereby, the skew between each of reset-edges outputted from the formatter circuit 21 is eliminated, and each of reset edges is inputted into the logical add circuit 42 at the same timing, and these reset-edges are composed as one reset-edge signal.

In the same manner, the skew correction is conducted in also the formatter circuit 2, and the set-edge signal and the reset edge signal are respectively composed.

That is, the skew correction circuits 35 and 36 of the formatter circuit 2 correct the skew of the reset-edge signals inputted into the logical add circuit 43. Concretely, because the timing edge B4 inputted into the skew correction circuit 35 as the reset-edge, is a low level "L", this skew correction circuit 35 supplies this low level "L" to the logical add circuit 43 as it is.

The skew correction circuit 36 into which the timing edge B6 is inputted as the set-edge, uses the timing edge B5 separated as the set-edge as the reference, and corrects the timing of the timing edge B6, and corrects the skew between them. Thereby, the skew between each of set-edges outputted from the formatter circuit 22 is eliminated, and each of set edges is inputted into the logical add circuit 43 at the same timing, and these set-edges are composed as one set-edge signal.

Further, the skew correction circuits 37 and 38 of the formatter circuit 2 correct the skew of the reset-edge signals inputted into the logical add circuit 44 so that the timing of reset-edge signals match with each other.

This will be concretely described. Because the timing edge B4 inputted into the skew correction circuit 37 as the reset-edge, is a low level "L", this skew correction circuit 37 supplies this low level "L" to the logical add circuit 44 as it is. The skew correction circuit 36 into which the timing edge B6 is inputted as the reset-edge, uses the timing edge B5 separated as the reset-edge as the reference, and corrects the timing of the timing edge B6, and corrects the skew between them. Thereby, the skew between each of reset-edges outputted from the formatter circuit 22 is eliminated, and each of reset edges is inputted into the logical add circuit 44 at the same timing, and these reset-edges are composed as one reset-edge signal.

According to this, from the formatter circuits 1 and 2, the set edge signal in which a plurality of set edges are arranged, and the reset edge signal in which a plurality of reset edges are arranged, are paired as one pair, and respectively outputted for each channel.

Incidentally, in this operation mode, because signals of each format channel are not composed, and the channel signals corresponding to the output signal of each format channel are generated, logical add circuits 61 to 64 which contribute to the composition of the signals, do not function. Accordingly, the operation including these logical add circuits 61 to 64 will be described in the next, operation of the link mode.

Next, the operation of the link mode in which the format channel 1 and the format channel 2 are linked and each channel signal is generated, will be described.

In this operation mode, the logical add circuit 61 and the logical add circuit 63 conduct respectively the logical add of both set-edge signals respectively outputted from the format channel 1 and the format channel 2, and respectively compose them, and the timing edges D1 and D3 shown in FIG. 2 are generated. Further, the logical add circuit 62 and the logical add circuit 64 respectively conduct the logical add of both reset-edge signals, and respectively compose them, and the timing edges D2 and D4 shown in FIG. 2 are generated. At this time, as shown in FIGS. 3A and 3B, the skew correction circuit 51 uses a set-edge signal SE1 outputted from the format channel 1 (corresponding signal generation section) as the reference, and corrects the phase of a set-edge signal SE2 outputted from the format channel 2 (other signal generation section), and corrects the skew so that the timing between these signals is almost the same.

Figure 3A:
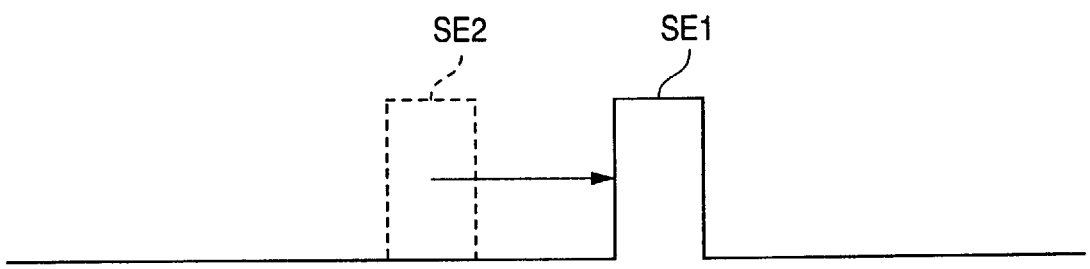
FIGS. 3A and 3B are illustration for explaining a correction method of the skew according to the embodiment 1 of the present invention.

Herein, FIG. 3A shows the correction method of the skew in the case where the phase of the set-edge signal SE2 is faster than that of the set edge signal SE1. In this case, the skew correction circuit increases the delay amount and delays the phase of the set-edge signal SE2 so as to match with the phase of the set-edge signal SE1.

Figure 3B:
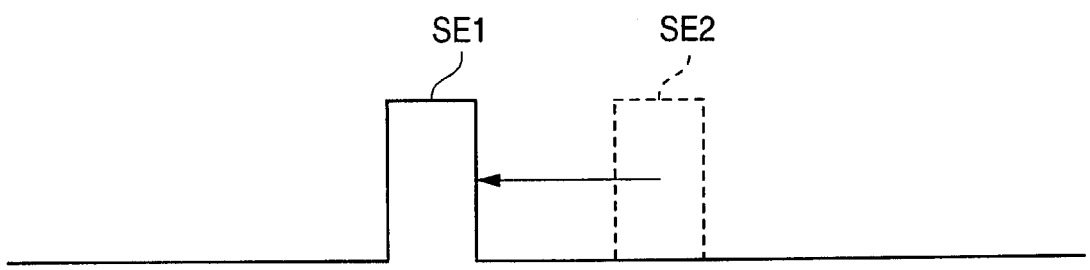

Further, FIG. 3B shows the correction method of the skew in the case where the phase of the set-edge signal SE2 is later than that of the set edge signal SE1. In this case, the skew correction circuit decreases the delay amount and advances the phase of the set-edge signal SE2 so as to match with the phase of the set-edge signal SE1.

Incidentally, in order to enable the phase to be controlled, for example, the phase of the set-edge signal SE1 outputted from the format channel 1, which is used as the reference, is delayed by a predetermined amount, and is set previously, for example, in the vicinity of the center in the control range of the phase. According to this, by only adjusting the delay amount of the phase of the set edge signal SE2, the phase of the set edge signal SE2 can be delayed or advanced so as to mach with the phase of the set-edge signal SE1.

On the one hand, the skew correction circuit 52 uses a reset-edge signal outputted from the format channel 1 (corresponding signal generation section) as the reference, and corrects the phase of a reset-edge signal outputted from the format channel 2, and corrects the skew so that the timing between these signals is almost the same. In the same manner, the skew correction circuit 53 uses a set-edge signal outputted from the format channel 2 as the reference, and corrects the skew of a set-edge signal outputted from the format channel 2, and the skew correction circuit 54 uses a reset-edge signal outputted from the format channel 2 as the reference, and corrects the skew of a reset-edge signal outputted from the format channel 1.

According to this, into the logical add circuit 61 and the logical add circuit 62 which are provided to correspond to the formatter circuit 1, the set-edge signal and the reset-edge signal from the formatter circuit 2, in which the timing edge signal outputted from the formatter circuit 1 is used as the reference and the skew is corrected, are inputted. Further, into the logical add circuit 63 and the logical add circuit 64 which are provided to correspond to the formatter circuit 2, the set-edge signal and the reset-edge signal from the formatter circuit 1, in which the timing edge signal outputted from the formatter circuit 2 is used as the reference and the skew is corrected, are inputted.

Then, the logical add circuit 61 and the logical add circuit 63 conduct the logical add of the set-edges respectively generated by the format channel 1 and the format channel 2, and respectively compose them to one signal D1, and D3, and output the timing edges D1 and D3 of the set-edges in which the set-edges generated by each format channel are arranged together. In the same manner, the logical add circuit 62 and the logical add circuit 64 conduct the logical add of the reset-edges respectively generated by the format channel 1 and the format channel 2, and respectively compose them to one signal, and output the timing edges D2 and D4 of the reset-edges in which the reset-edges generated by each format channel are arranged together.

Herein, for example, the skew of the signal inputted from the formatter circuit 2 into the logical add circuit 61 of the formatter circuit 1 side, is corrected by the skew correction circuit 51, and the skew of the signal inputted from the formatter circuit 1 into the logical add circuit 63 of the formatter circuit 2 side, is corrected by the skew correction circuit 53.

That is, the skews of the signals respectively inputted into the logical add circuit 61 and the logical add circuit 63, are separately corrected by the skew correction circuit 51 and the skew correction circuit 53. Thereby, in the link mode, into both of the logical add circuit 61 and the logical add circuit 63, the set-edge signals whose skews are corrected, are inputted, and the logical add of them are respectively operated and outputted.

In the same manner, the skew of the signal inputted from the formatter circuit 2 into the logical add circuit 62 of the formatter circuit 1 side, is corrected by the skew correction circuit 52, the skew of the signal inputted from the formatter circuit 1 into the logical add circuit 64 of the formatter circuit 2 side, is corrected by the skew correction circuit 54, and the skews of the signals respectively inputted into each logical add circuit, are individually corrected. Thereby, into the logical add circuit 61 and the logical add circuit 63, the rest signals whose skews are corrected, are respectively inputted, and the logical add of them is operated.

As the result, the set-edge signal D1 and the reset-edge signal D2 whose skews are corrected, are outputted from the logical add circuit 61 and the logical add circuit 62 which are provided to correspond to the formatter circuit 1, and the reset-edge signal D3 and the reset-edge signal D4 whose skews are corrected, are outputted from the logical add circuit 63 and the logical add circuit 64 which are provided to correspond to the formatter circuit 2.

Accordingly, in the link mode in which a plurality of formatter circuits are linked, the generation of the signal whose skew is corrected can be conducted to each channel, and each channel becomes effective. Accordingly, even in the link channel, because the number of effective channels is not decreased, the number of generable signals is not decreased, and the high speed test can be simultaneously conducted to the devices to be measured whose number is equal to that in the normal mode.

As described above, the signal generation circuit according to the embodiment 1 conducts the following: each output signal from the formatter circuits 21 and 22 is skew-corrected by the skew correction circuits 31 to 38; for example, the skew correction circuits 51 is added, and the skew correction is conducted on the waveform after the link; thereby, when the format channel 1 and the format channel 2 are simultaneously used, the skew correction is conducted.

According to the embodiment 1, because the exclusive use timing correction circuit for the link mode is used, even when 2 format channels are simultaneously used at the time of the link, the number of effective channels is not decreased. Accordingly, without decreasing the number of semiconductor integrated circuits, which are objects to be tested, the skew of signal of each channel can be corrected. Further, because the data for the skew correction can be held exclusively, the transferring time of the data for the skew correction can be shortened, and the data transfer efficiency is increased in the link mode of the semiconductor testing apparatus. Accordingly, the reduction of the measurement time and the increase of the number of simultaneous measurement can be realized.

Embodiment 2

Figure 4:
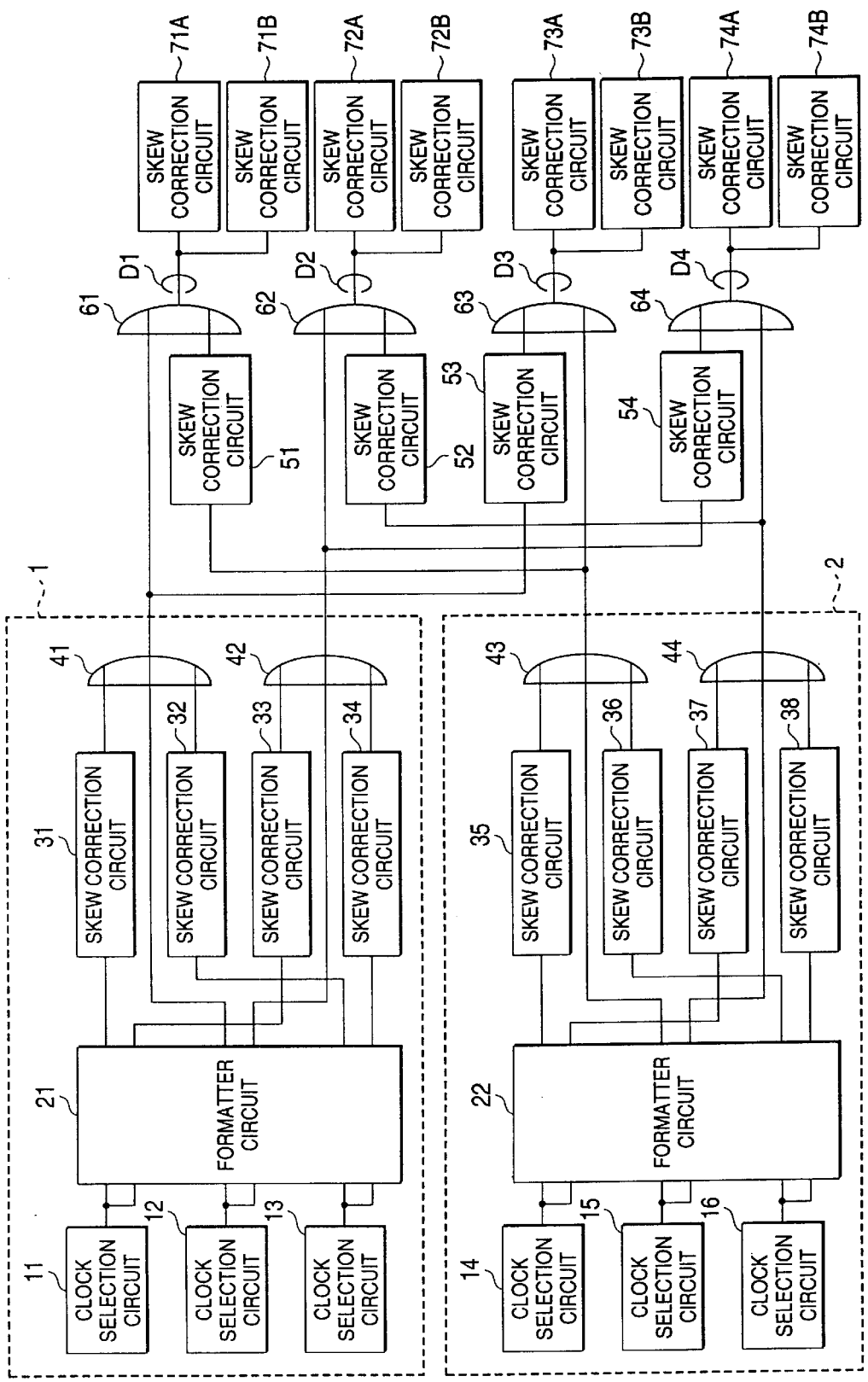
FIG. 4 is a block diagram showing the s structure (at the time of t he link mode) of the signal generation circuit according to the embodiment 2 of the present invention.

Referring to FIG. 4, the embodiment 2 according to the present invention will be described.

In FIG. 4, the structure of the signal generation circuit according to the present invention will be shown. In FIG. 4, elements common to the elements shown in FIG. 1 are denoted by the same codes. As shown in FIG. 4, in the structure according to the embodiment 1 shown in FIG. 1, the signal generation circuit is structured by further providing skew correction circuits 71A, 71B to 74A, 74B to the output section of the logical add circuits 61 to 64.

That is, the skew correction circuits 71A and 71B are connected in parallel to the output of the logical add circuit 61, the skew correction circuits 72A and 72B are connected in parallel to the output of the logical add circuit 62, the skew correction circuits 73A and 73B are connected in parallel to the output of the logical add circuit 63, and the skew correction circuits 74A and 74B are connected in parallel to the output of the logical add circuit 64. In each of skew correction circuits, the correction value (a delay amount of the phase) can be independently set.

According to the embodiment 2, in the normal mode, the skews between signals respectively outputted from the logical add circuits 61 to 64 can be corrected by the skew correction circuits 71A, 71B to 74A, 74B. Accordingly, when, in the normal mode, signals of a plurality of channels are applied onto the same device and the test is conducted, the skew between each channel can be eliminated, and in the link mode, as described in the embodiment 1, the skews of the signals outputted from each formatter circuit are corrected by the skew correction circuits 51 to 54, and the skews between respective channel signals can be corrected by the skew correction circuits 71A, 71B to 74A, 74B.

Further, because 2 skew correction circuits are provided to respective output sections of the logical add circuits 61 to 64, each of outputs of the logical add circuits 61 to 64 can be generated for 2 systems, and the skew of each system can be independently corrected.

In the foregoing, the embodiments 1 and 2 of the present invention are described, however, the present invention is not limited to the embodiments 1 and 2. However, even when there is a change of design in the scope which does not depart from the essential points of the invention, it is included in the present invention. For example, in the above-described embodiments 1 and 2, 2 formatter circuits of the formatter circuit 1 and the formatter circuit 2 are linked, however, the present invention is not limited to this, but the invention may be structured such that more formatter circuits are linked.

Further, in the above-described embodiments 1 and 2, to each of the 2-inputs type logical add circuits 61 to 64, in the 2-input section, the skew correction circuit is provided to only one input section, however, the skew correction circuits may also be provided to both input sections. It is also the same for the logical add circuits 41 to 44.

Further, in the above described embodiment 2, to respective output sections of the logical add circuits 61 to 64, 2 skew correction circuits are provided, however, the invention is not limited to this, but the number of skew correction circuits connected to each output section may be set at need.

As described above, according to the present invention, the following effects can be obtained.

That is, according to the present invention, because a signal is generated according to the waveform information designated by the program, the signal outputted from the corresponding signal generation section is used as the reference, the skew of the signal outputted from the other generation section is corrected, and the signal from the corresponding skew correction section and the signal from the signal generation section to which this skew correction section corresponds, are composed, thereby, the data transfer amount to the skew correction circuit can be reduced when two operation modes of the link mode and the normal mode are switched, and without decreasing the number of effective channels and the number of the device to be measured, each format channel can be simultaneously used, and the measurement time of the integrated circuit which is the object to be tested, can be reduced.

Further, because the signal outputted from the corresponding signal generation section is used as the reference, and the skew of the signal from the other signal generation section is corrected so as to match with that signal, the skew between signals from the signal generation section and the skew correction section which correspond to each other, can be eliminated, and these signals can be composed to one signal.

Further, the timing edge is selected according to the waveform information; the selected timing edge is separated to the set-edge or reset-edge; the skew between separated set-edges is corrected; the skew between separated reset-edges is corrected; the logical add is conducted on set-edges whose skews are corrected; and the logical add is conducted on reset-edges whose skews are corrected, thereby, the signal whose skew is corrected can be generated according to the waveform information designated by the program, and the set-edge and the reset-edge whose skews are corrected, and which are composed, can be obtained.

Further, because the signal composition section is structured by the logical add circuit, signals can be logically composed. Further, because the skew correction section is structured by the delay circuit, by increasing or decreasing the delay amount, the skew can be corrected. Furthermore, because the skew between each of signals respectively outputted from the signal composition section is corrected, the skew of the signal outputted from each signal composition section can be corrected, and the skew between these signals can be eliminated.

Further, in the structure, in which a plurality of selection circuits, each of which selects one of a plurality of timing edges, are provided; the outputs of them are connected to the formatter circuit; the outputs from the formatter circuit is connected to the logical add circuits; and the output of the logical add circuit is connected to the composition circuit by which the output is composed with the same other output, because the skew of the signal inputted from the logical add circuit into the composition circuit is corrected, the skew of the signal outputted from the logical add circuit to the composition circuit can be corrected.

What is claimed is:

1. A signal generation circuit of a semiconductor testing apparatus comprising:
   a plurality of signal generation sections to generate a signal according to the waveform information designated by a program to output;
   a plurality of skew correction sections which are provided corresponding to said plurality of signal generation sections, and by using the signal outputted from corresponding signal generation section as the reference, correct the skew of the signal outputted from the other signal generation sections; and
   a plurality of signal composition sections which are provided corresponding to said plurality of skew correction sections, and compose the signal from said corresponding skew correction section and the signal from said signal generation section to which said skew correction section corresponds.

2. The signal generation circuit of a semiconductor testing apparatus according to claim 1, wherein
   each of said plurality of signal generation sections comprises:
   a plurality of selection circuits to respectively select one from a plurality of previously prepared timing edges according to the waveform information;
   a formatter circuit to separate each of timing edges selected by said plurality of selection circuits, according to the waveform information, into a set-edge and a reset-edge to output;
   a first skew correction circuit to correct the skew between respective set-edges separated by said formatter circuit;
   a second skew correction circuit to correct the skew between respective reset-edges separated by said formatter circuit;
   a first logical add circuit to conduct the logical add of the set-edges whose skews are corrected by said first skew correction circuit; and
   a second logical add circuit to conduct the logical add of the reset-edges whose skews are corrected by said second skew correction circuit.

3. The signal generation circuit of a semiconductor testing apparatus according to claim 1, wherein
   said plurality of signal composition sections comprise logical add circuits.

4. The signal generation circuit of a semiconductor testing apparatus according to claim 1, wherein
   said plurality of skew correction sections comprise:
   delay circuits.

5. The signal generation circuit of a semiconductor testing apparatus according to claim 1, further comprising:
   skew correction sections to correct the skew between each of signals respectively outputted from said plurality of signal composition sections.

6. A signal generation circuit of a semiconductor testing apparatus comprising:
   a plurality of selection circuits to select one from a plurality of timing edges, and
   a correction circuit to correct the skew of the signal, inputted from a logical add circuit into a composition circuit, wherein
   the output of said selection circuit is connected to a formatter circuit,
   the output from said formatter circuit is connected to said logical add circuit,
   the output of said logical add circuit is connected to said composition circuit by which the output of said logical add circuit is composed with the same other outputs.

* * * * *